United States Patent [19]
Lau et al.

[11] Patent Number: 5,956,252
[45] Date of Patent: Sep. 21, 1999

[54] METHOD AND APPARATUS FOR AN INTEGRATED CIRCUIT THAT IS RECONFIGURABLE BASED ON TESTING RESULTS

[75] Inventors: Lee K. Lau, Don Mills; Robert P. Bicevskis, Richmond Hill, both of Canada

[73] Assignee: ATI International, India

[21] Appl. No.: 08/853,303

[22] Filed: May 9, 1997

Related U.S. Application Data

[63] Continuation-in-part of application No. 08/841,284, Apr. 29, 1997.

[51] Int. Cl.[6] ................................................. G06F 19/00
[52] U.S. Cl. ........................... 364/468.28; 364/468.24; 324/755
[58] Field of Search ................ 364/468.28; 324/755, 324/756, 758, 760

[56] References Cited

U.S. PATENT DOCUMENTS

| | | | |
|---|---|---|---|
| 5,440,241 | 8/1995 | King et al. | 324/765 |
| 5,442,282 | 8/1995 | Rostoka et al. | 324/158.1 |
| 5,663,654 | 9/1997 | Wood et al. | 324/758 |
| 5,726,580 | 3/1998 | Wood et al. | 324/758 |

*Primary Examiner*—Paul P. Gordon
*Attorney, Agent, or Firm*—Markison & Reckamp, P.C.

[57] ABSTRACT

A method and apparatus for reconfiguring an integrated circuit based on testing results is accomplished by an integrated circuit that includes a first circuit, a second circuit, and configuration circuitry deposited on a single die. After testing of the die, the configuration circuitry configures the integrated circuit based on the results of the testing. If both circuits passed the testing, the configuration circuitry couples, where appropriate, the first and second circuits together. If, however, the first circuit failed the testing and the second circuit passed the testing, the configuration circuitry configures the integrated circuit as if only the second circuit were present on the die. If, however, the second circuit failed the testing and the first circuit passed the testing, the configuration circuitry configures the integrated circuit as if only the first circuit were present on the die.

19 Claims, 5 Drawing Sheets

METHOD AND APPARATUS FOR AN INTEGRATED CIRCUIT THAT IS RECONFIGURABLE BASED ON TESTING RESULTS

This patent application is a continuation in part of co-pending patent application filed Apr. 29, 1997 entitled METHOD AND APPARATUS FOR EXTENDING MEMORY OF AN INTEGRATED CIRCUIT, having the same assignee as the present patent application, and having application Ser. No. 08/841,284.

TECHNICAL FIELD OF THE INVENTION

This invention relates generally to integrated circuits (IC) and more particularly to an integrated circuit that is reconfigurable based on testing results.

BACKGROUND OF THE INVENTION

Integrated circuits (IC) are known to include a package that houses at least one die which is coupled to a plurality of pads, or pins. The size of the package, and hence the size of the IC, depends on the size of the die or dies and the number of required pins. In turn, the die size depends on the complexity of the circuit(s) deposited thereon and the size of the gate oxide layer. The less complex the circuit and/or the smaller the gate oxide layer, the smaller the resulting die.

As advances in IC manufacturing techniques continue to occur, the size of the gate oxide layer continues to decrease. For example, current state of the art gate oxide layer size is approximately 0.35 micron ($\mu$), where a typical gate oxide layer size is $0.60\mu$. As the size of the gate oxide layer decreases, more complex circuit may be deposited on a single, smaller, die. Thus, an IC manufacturer may produce smaller, more complex, integrated circuits using smaller gate oxide layers. This, however, comes with a tradeoff of lower yields (more dies fail to pass testing). Thus, an IC manufacturer will balance circuit complexity, die size, and desired yield.

For example, if an IC manufacturer produces a video graphics controller integrated circuit using $0.6\mu$ gate oxide layer technology, the IC manufacture may expect a yield of approximately eighty percent, while a 2 Mbyte RAM, using the same $0.6\mu$, may have a yield of approximately eighty-five percent. If the IC manufacturer were to combine these two circuits (i.e., the video graphics controller and the 2 Mbyte RAM) on to a single die using the same gate oxide layer size, the expected yield would be sixty eight percent (0.8*0.85). The expected yield would be even lower if the IC manufacturer used a smaller gate oxide layer size.

Because of the above mentioned decrease in yield, IC manufacturers are reluctant to place two such separate circuits on a single die. In addition to the lower yields, testing of such a die requires more time because of the additional circuitry, thereby further decreasing the effective yield. The effective yield is decreased even if one of the separate circuits was completely functional (i.e., passed testing) because the overall die did not pass. Thus, when such a partial functioning die is detected, it is scrapped as if the entire die failed. As one can image, such scrapping of dies is costly to the IC manufacturer and to the subsequent IC consumers.

Therefore, a need exists for an method and apparatus for reconfiguring an integrated circuit based on testing results.

DETAILED DESCRIPTION OF THE DRAWINGS

Generally, the present invention provides a method and apparatus for reconfiguring an integrated circuit based on testing results. This may be accomplished by an integrated circuit that includes a first circuit, a second circuit, and configuration circuitry deposited on a single die. After testing of the die, the configuration circuitry configures the integrated circuit based on the results of the testing. If both circuits passed the testing, the configuration circuitry couples, where appropriate, the first and second circuits together. If, however, the first circuit failed the testing and the second circuit passed the testing, the configuration circuitry configures the integrated circuit as if only the second circuit were present on the die. If, however, the second circuit failed the testing and the first circuit passed the testing, the configuration circuitry configures the integrated circuit as if only the first circuit were present on the die. With such a method and apparatus, the present invention allows partial functioning dies to be packaged and sold as a first or second circuit IC. By utilizing the partially functioning dies, an IC manufacturer avoids the cost of scrapping partially functioning dies.

Figure 1:
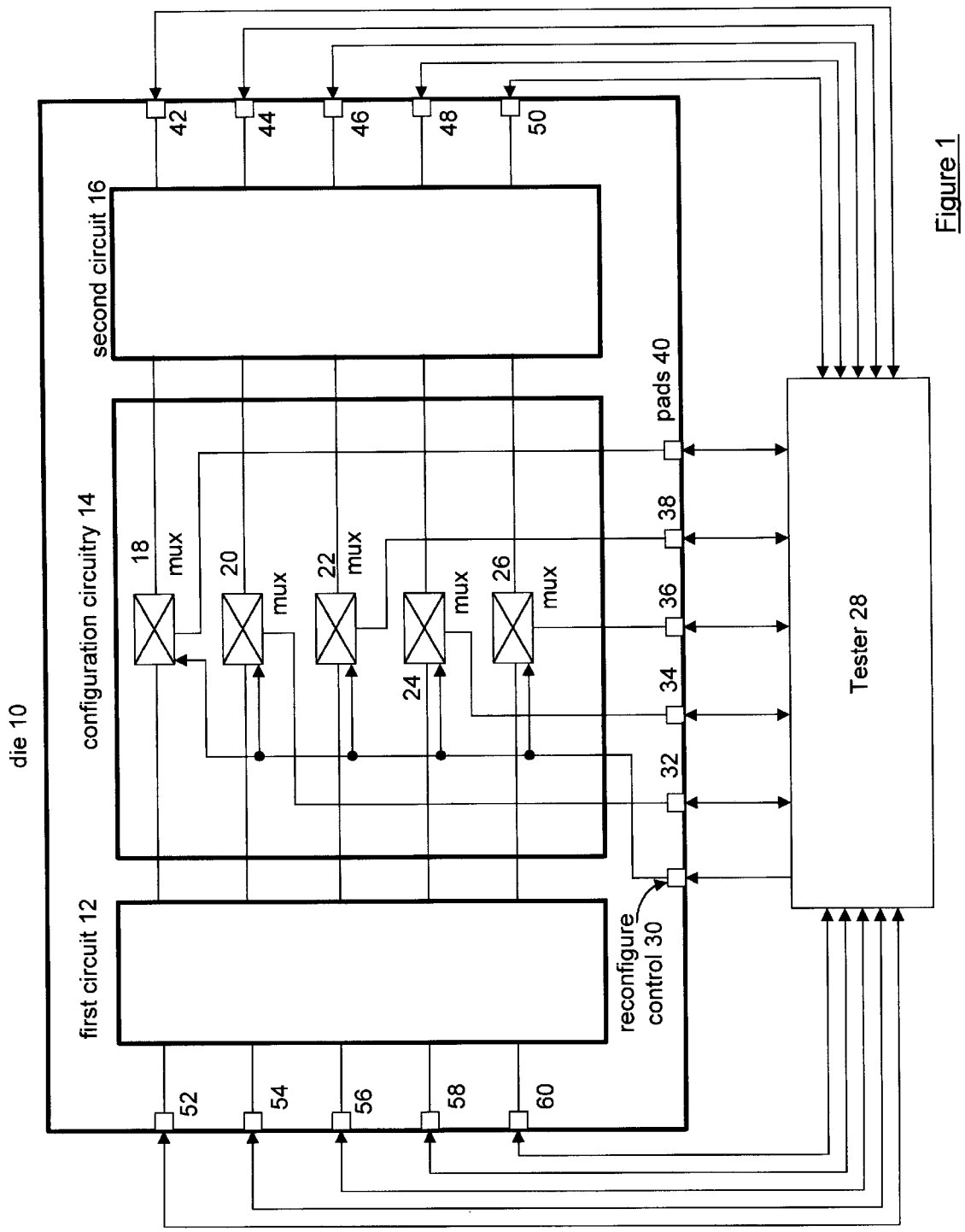
FIG. 1 illustrates a schematic block diagram of an integrated circuit which is in accordance with the present invention.

The present invention can be more fully described with reference to FIGS. 1 through 5. FIG. 1 illustrates a schematic block diagram of a die 10, which may be packaged into an integrated circuit. The die 10 has deposited thereon, a first circuit 12, a second circuit 16, and configuration circuitry 14. The first circuit 12 may be a processor such as a video graphics processor, a microprocessor, a microcontroller, a microcomputer, or a digital signal processor, while the second circuit 16 may be another processor or memory, such as read only memory (ROM) or random access memory (RAM) configured as an X K by Y bit memory. As one skilled in the art will readily appreciate, the first and second circuits may be any type of circuit that may be, or currently is, packaged as a separate integrated circuit.

The die 10, after it has been fabricated, is coupled to a tester 28. As is well understood in the art, the tester 28 provides a series of test patterns, or vectors, to certain I/O pins of the die to test one and/or both the first and second circuits 12 and 16. Once the test vector is provided, the tester 28 monitors certain I/O pins for an output response to the test vector. If the output response matches an anticipated output, the first and/or second circuit 12 and 16 passed the test for this test vector. Another test vector is then applied to the die to test a different portion of the first and/or second circuits 12 and 16. If the output response is as anticipated, the next test vector is supplied to the die. This process continues until all of the test vectors have been successfully processed or until a failure is detected. If a failure is detected within one of the first or second circuits 12 or 16, the remaining test vectors supplied to the die 10 are only for the circuit 12 or 16 that as not yet failed or passed.

In the illustration of FIG. 1, the tester 28 is coupled to I/O pins 32–40, 42–50, and 52–60. In a testing mode of the first circuit 12, the tester 28 provides a configuration control signal to the configuration circuitry 14 which causes the configuration circuitry 14 to couple, via the multiplexors 18–26, the first circuit 12 to the I/O pins 32–40, while placing the connections to the second circuit 16 in a high impedance state. Coupled in this manner, the tester 28 can monitor the inputs and outputs of the first circuit 12, thereby thoroughly testing it independently of the second circuit 16. Conversely, the tester 28 may provide a configuration control signal to the configuration circuitry 14 that causes it to couple, via the multiplexors 18–26, the second circuit 16 to the I/O pins 32–40, while placing the connections to the first circuit 12 in a high impedance state. Coupled in this manner, the tester 28 can thoroughly test the second circuit 16 independent of the first circuit 12. The tester 28 may further provide a configuration control signal to the configuration circuitry 14 that causes the configuration circuitry to couple the first circuit 12 to the second circuit 16, such that the tester 28 can test the interoperability of the first and second circuits 12 and 16.

As an alternative to the test vectors, or in addition to them, the tester 28 may generate a laser signal that exercises the circuits 12 and 16. The laser signal is especially adept at testing memories. Thus, if the second circuit 16, is a memory, the laser signal would test the functionality of the memory. If the first circuit 12 is a processor, the tester 28 may provide it with the test vectors. As one skilled in the art will readily appreciate, there are many manners in which a die may be tested and all such dies include some diagnostic interface control circuitry, such that pins, or pads, may be bootstrapped in one manner for testing and another manner for die utilization.

If, after testing the die, it was determined that either the first or the second circuit 12 or 16 failed the testing, the reconfiguration pin 30, which may be one to several pads, is set to a state which causes the configuration circuitry 14 to configure the die to exclude the circuit 12 or 16 that failed. For example, assume that the second circuit 16 failed, the reconfiguration pin 30 would be coupled to indicate this (Eg. tied low), thereby causing the configuration circuitry 14 to couple, via the multiplexors 18–26, the first circuit 12 to the I/O pins 32–40, while leaving the connections to the second circuit 16 in a high impedance state. When coupled in this manner, the die could be packaged as a first circuit integrated circuit. For example, if the first circuit 12 were a processor, such as a video processor or microprocessor, the resulting integrated circuit would be a video processor or microprocessor integrated circuit.

Conversely, if the first circuit 12 failed the test, the reconfiguration pin 30 would indicate this (Eg. tied high), thereby causing the configuration circuitry 14 to couple, via the multiplexors 18–26, the second circuit 16 to the I/O pins 32–40, while leaving the connections to the first circuit 12 in a high impedance state. When coupled in this manner, the die could be packaged as a second circuit integrated circuit. For example, if the second circuit 16 were memory, the resulting integrated circuit would be a memory integrated circuit. When both the first and second circuits 12 and 16 passed the testing, the reconfiguration pin 30 would indicate this (Eg. left open), thereby causing the configuration circuitry 14 to couple the first circuit 12 to the second circuit 16.

Figure 2:
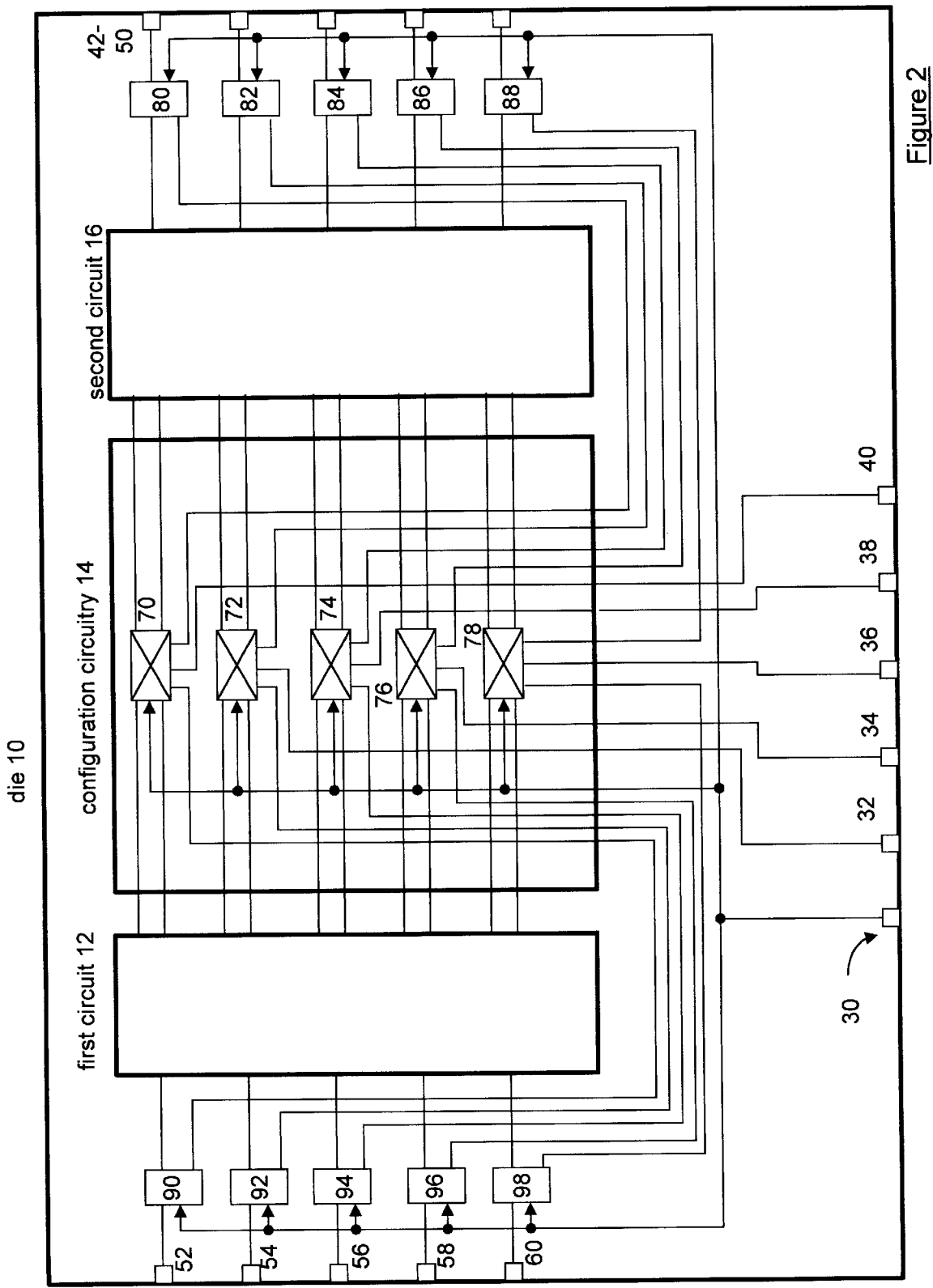
FIG. 2 illustrates a schematic block diagram of an alternate integrated circuit which is in accordance with the present invention.

FIG. 2 illustrates a schematic block diagram of an alternate die 10 that has, deposited thereon, the first circuit 12, the second circuit 16, and the configuration circuitry 14. The first circuit 12 may be a processor such as a video graphics processor, a microprocessor, a microcontroller, a microcomputer, or a digital signal processor, while the second circuit 16 may be another processor or memory, such as read only memory (ROM) or random access memory (RAM) configured as an X K by Y bit memory. As one skilled in the art will readily appreciate, the first and second circuits may be any type of circuit that may be, or currently is, packaged as a separate integrated circuit. Note that the difference between the first and second circuits 12 and 16 of FIGS. 1 and 2 is that the first and second circuits 12 of FIG. 2 include many more interconnections between the two circuits than in FIG. 1.

The die 10 of FIG. 2 would similarly be coupled to the tester 28, which would test the first and second circuits 12 and 16 individually and together. In this embodiment of the die 10, the tester 28 would also control multiplexors 80–88 and 90–98 which muxes access to I/O pins 42–50 and 52–60 between the configuration circuitry 14 and the second circuit 16 and the configuration circuitry 14 and the first circuit 12, respectively. In other words, when the tester 28 is testing the first circuit 12, the multiplexors 80–88 and 90–98, which may be physical multiplexors, electrical multiplexors, or cross bar switches, couple the first circuit 12 to the I/O pins 42–50 and 52–60, where the coupling to I/O pins 42–50 are through the multiplexors 70–78 of the configuration circuitry 14. Conversely, when the tester 28 is testing the second circuit 16, the multiplexors 80–88 and 90–98 couple the second circuit 16 to the I/O pins 42–50 and 52–60, where the coupling to I/O pins 52–60 are through the multiplexors 70–78 of the configuration circuitry 14.

When it is determined through testing that the first circuit 12 or the second circuit 16 failed testing, the reconfiguration pin 30 is biased to effectively remove the failed circuit 12 or 16. The biasing of the reconfiguration pin 30 may be done at subsequent manufacturing steps of the IC by permanently tying the configuration pin 30 to a given potential source. For example, by coupling the reconfiguration pin 30 to circuit ground would effectively remove the second circuit 16, coupling the reconfiguration pin 30 to the voltage source would effectively remove the first circuit 12, and floating, with respect to the configuration circuitry 14, the reconfiguration pin 30 would enable both circuits 12 and 16. Note that when the reconfiguration pin 30 is floated, it may be used as another I/O pin, or control pin, address pin, etc. Further note that, in the alternative, the configuration circuitry 14 may include a logic circuit that would permanently latch the reconfiguration pin 30 into the appropriate state.

As an example, assume that the first circuit 12 is a processor, such as a video processor, microprocessor, digital signal processor, etc., and the second circuit 16 is a 128 K by 128 bit RAM. In this example, there needs to be a minimum of 128 lines coupled to the memory just for data read/writes, many, if not all, would be directly to the processor. When both the processor and the memory pass testing, the configuration circuitry 14 sets the multiplexors 70–78 to couple the processor directly to the memory. In addition, multiplexors 80–88 and 90–98 would be set to couple the processor and the memory to I/O pins 42–50 and 32–40 and I/O pins 52–60, respectively, or set the multiplexors 80–88 and 90–98 to couple the processor to I/O pins 32–40, 42–50 and 52–60. If, however, the processor failed testing and the memory passed, the configuration circuitry 14 would set the multiplexors 70–78, 80–88, and 90–98 to couple the memory to I/O pins 32–40, 42–50 and 52–60.

If the die 10 has at least 145 pins (128 for data and 17 for addressing), the memory can be directly coupled to the I/O pins and used as a 128 K by 128 bit memory. But, when the die does not have sufficient pins, the memory can be reconfigured, via the configuration circuitry 14, as a 256 K by 64 bit memory. When reconfigured in this manner, the memory only needs 82 pins (64 for data and 18 for addressing). In general, an X K by Y bit memory may be reconfigured to an $X^*n$ K by Y/n bit memory under the control of the configuration circuitry 14. Co-pending patent application filed Apr. 29, 1997 entitled METHOD AND APPARATUS FOR EXTENDING MEMORY OF AN INTEGRATED CIRCUIT, having the same assignee as the present patent application, and having application Ser. No. 08/841,284 describes the configuration circuitry 14 and reconfiguring of memory in greater detail.

Continuing with the example, assume that the processor passed the testing but the memory failed. Under these circumstances, the configuration circuitry 14 would set the multiplexors 70–78, 80–88, and 90–98 to couple the processor to the I/O pins 32–40, 42–50, and 52–60. If the die 10 has at least 145 pins (128 for data read/writes to an external memory and 17 for addressing the external memory), the processor can be packaged as an integrated circuit. But, if the die does not have the necessary pins, the configuration circuitry 14 reconfigures the processor's memory access such that the processor is coupled to access a 256 K by 64 bit memory. Thus, only 82 pins are needed for the processor to access external memory. In general, the processor's access to external memory may be reconfigured from X K by Y bit to $X^*n$ K by Y/n.

Figure 3:
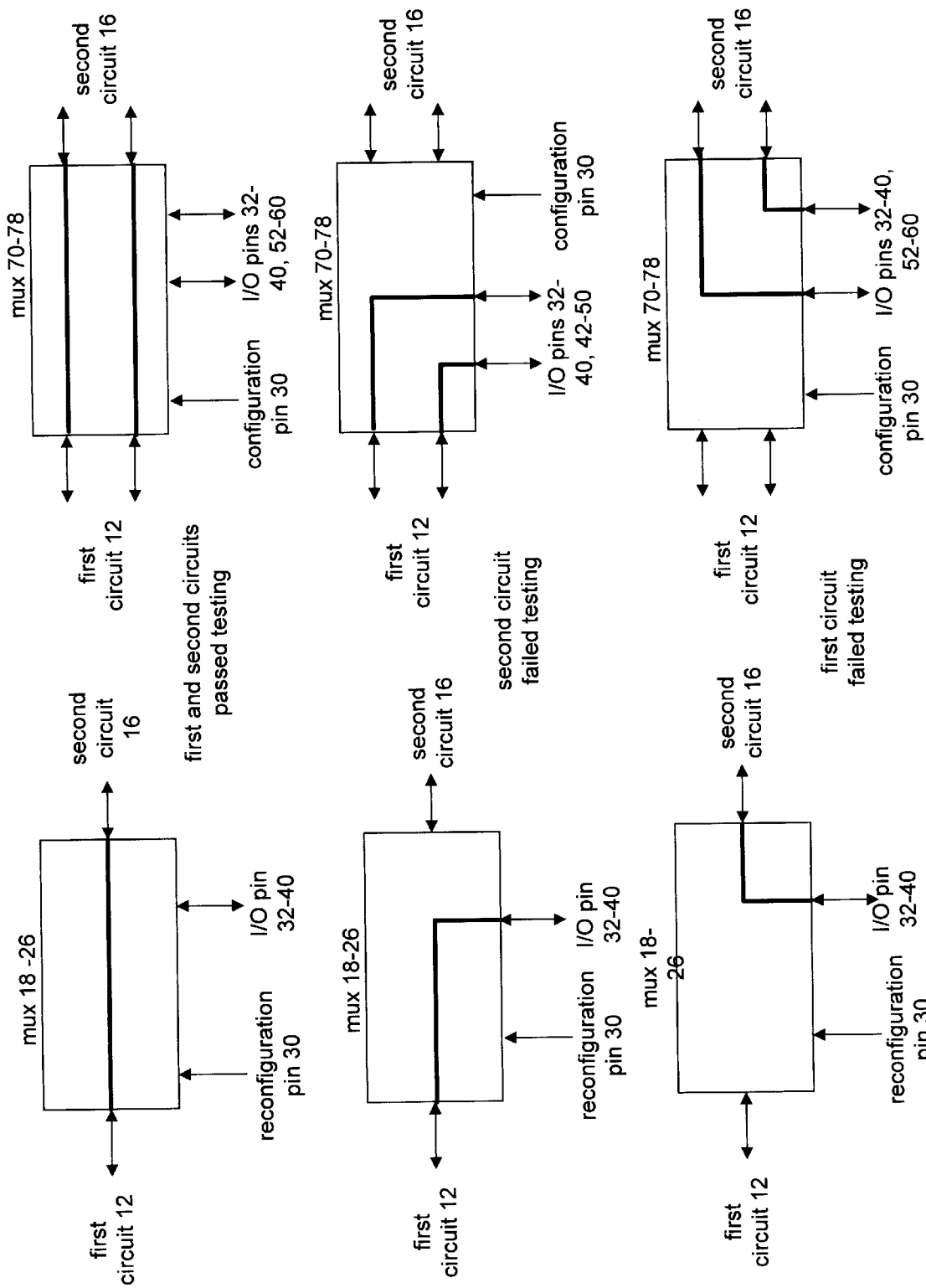
FIG. 3 illustrates a portion of the configuration circuitry in various configurations which is in accordance with the present invention.

FIG. 3 illustrates a multiplexor 18–26 or 70–78 of the configuration circuitry 14 in various configurations. In the first row of illustrations, the multiplexor 18–26 or 70–78 is configured based on both the first and second circuits passing the testing. Thus, the multiplexor 18–26 or 70–78 directly couples the first and second circuits 12 and 16 together. The I/O pins 32–40 are not used to provide external access for typical internal connections (i.e., the direct connections between the first and second circuits), thus may be used for other I/O functions. In the second row of illustrations, the multiplexor 18–26 or 70–78 is configured based on the second circuit failing the testing and the first circuit passing the testing. Thus, the multiplexor 18–26 or 70–78 directly couples the first circuit to the I/O pins 32–40 or I/O pins 32–40 and 42–50, respectively. In the third row of row of illustrations, the multiplexor 18–26 or 70–78 is configured based on the first circuit failing the testing and the second circuit passing the testing. Thus, the multiplexor 18–26 or 70–78 directly couples the second circuit to the I/O pins 32–40 or I/O pins 32–40 and 52–60, respectively.

Figure 4:
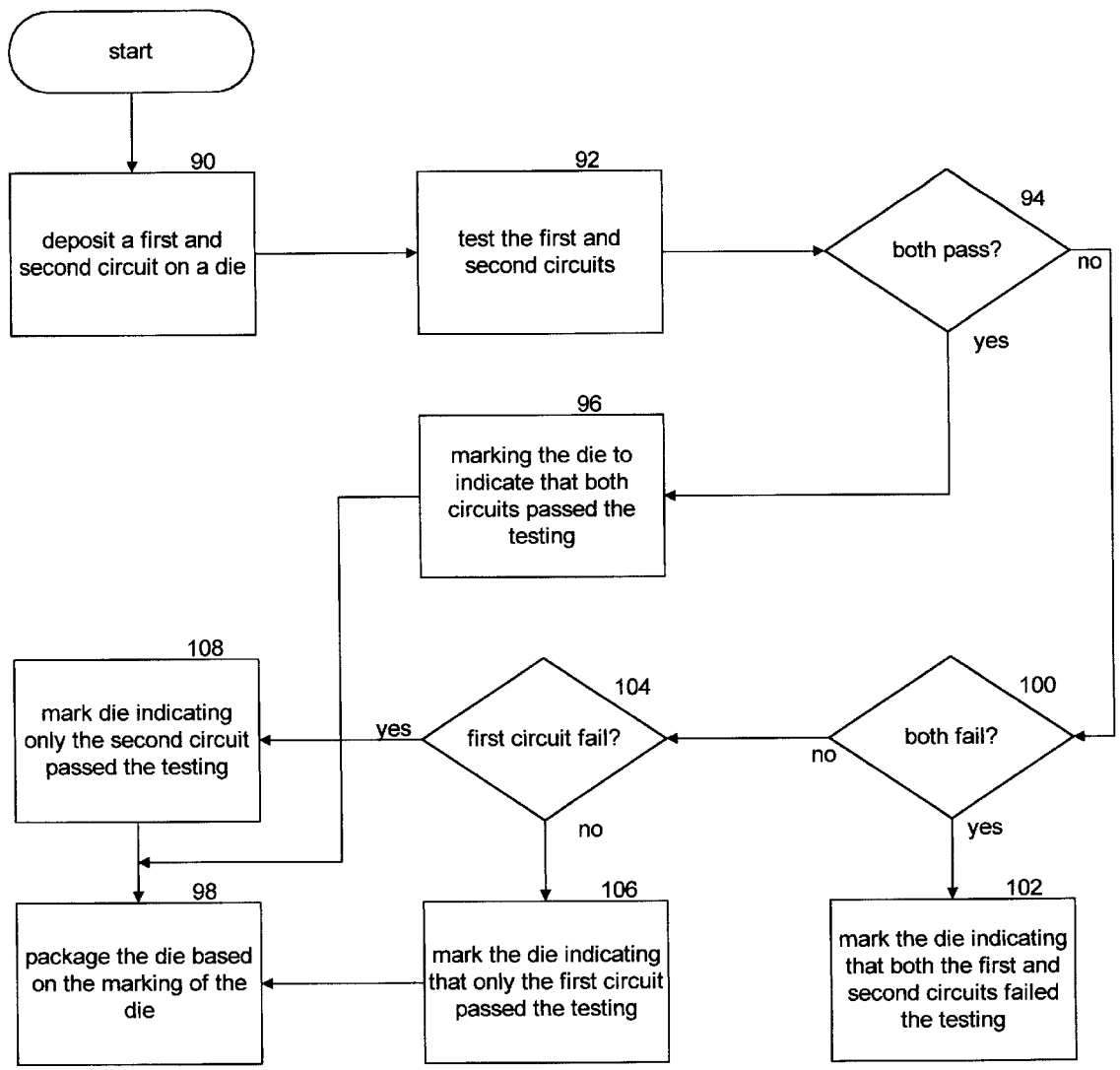
FIG. 4 illustrates a logic diagram that may be used to manufacture an integrated circuit in accordance with the present invention.

FIG. 4 illustrates a logic diagram that may be used to manufacture an integrated circuit in accordance with the present invention. The process begins at step 90 where a first and second circuits are deposited on a die. In addition, configuration circuitry would be deposited on the die. As previously mentioned, the first circuit may be a processor such as a video graphics processor, a microprocessor, a microcontroller, a microcomputer, or a digital signal processor, while the second circuit 16 may be another processor or memory, such as read only memory (ROM) or random access memory (RAM). Once the first and second circuits have been deposited on the die, the process proceeds to step 92 where the first and second circuits are tested. The process then proceeds to step 94 where a determination is made as to whether both circuits passed the testing. If both passed, the process proceeds to step 96 where the die is marked, or inked, to indicate that both circuits passed.

If, however, both circuits did not pass the testing, the process proceeds to step 100 where a determination is made as to whether both circuits failed the testing. If yes, the process proceeds to step 102 where the die is marked, or inked, indicating that both circuits failed the testing, such that the die may be scrapped. If, however, one of the circuits passed the testing, the process proceeds to step 104 where a determination is made as to whether the first circuit passed the testing. If yes, the process proceeds to step 108 where the die is marked to indicate that the first circuit, but not the second circuit, passed the testing. If the first circuit did not pass the testing, the process proceeds to step 106 where the die is marked to indicate that the second circuit, but the first circuit, passed the testing. Having marked the die to indicate that the first and/or second circuit passed the testing, the process proceeds to step 98 where the die is packaged based on the markings on the die. Thus, three different IC could be fabricated, one that includes the first and second circuits, one that functionally includes only the first circuit, and one that functionally includes only the second circuit. By utilizing partially functioning dies in this manner, an IC manufacturer can maintain acceptable yields and still employ state of the art IC fabrication techniques.

Figure 5:
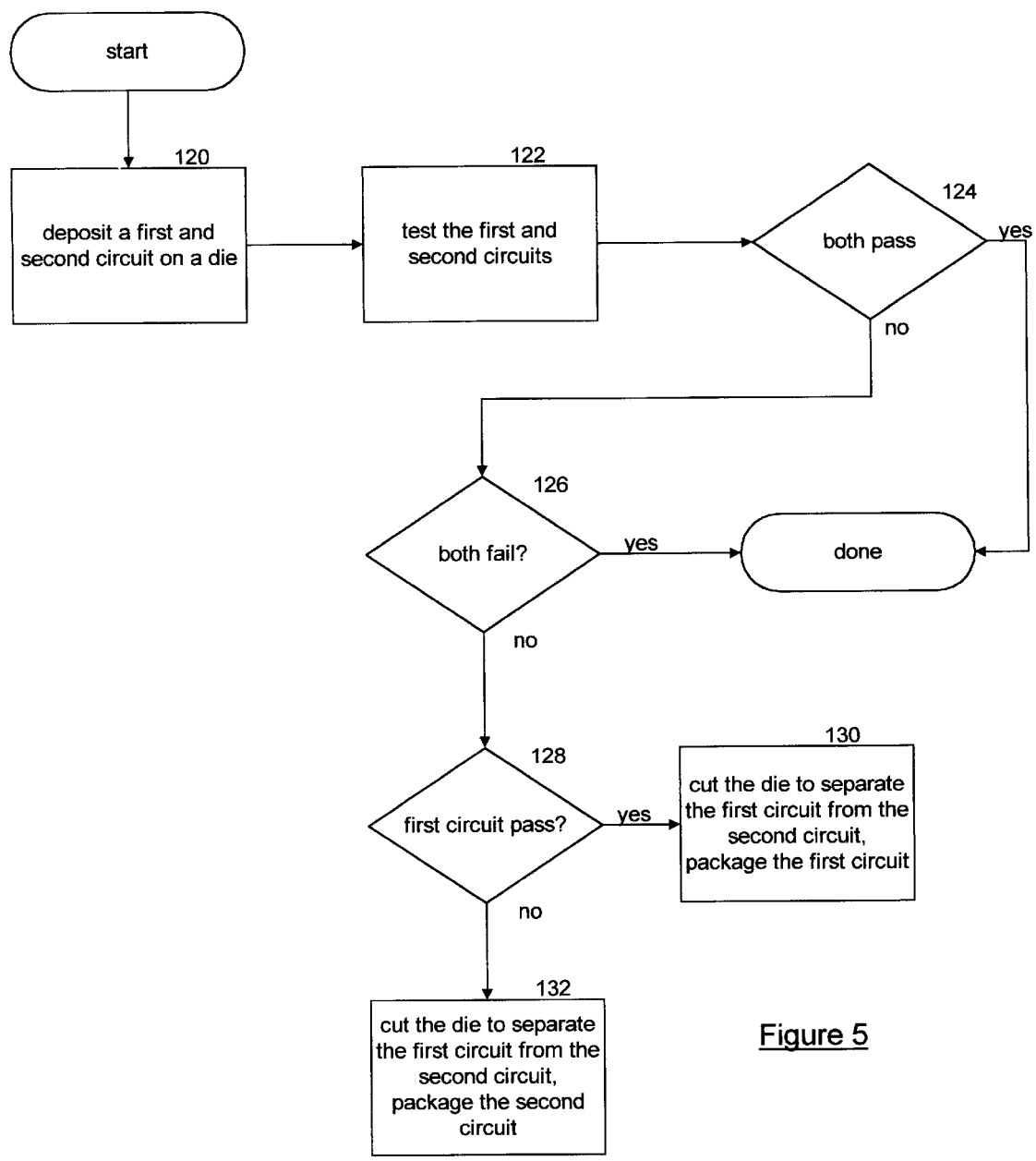
FIG. 5 illustrates a logic diagram that may be used to manufacture an alternate integrated circuit in accordance with the present invention.

FIG. 5 illustrates a logic diagram that may be used to manufacture an alternate integrated circuit in accordance with the present invention. The process begins at step 120 where a first and second circuits are deposited on a die. In additions, pads would be deposited between the first and second circuits as at least a portion of the configuration circuitry. Having deposited the first and second circuits on the die, the process proceeds to step 122 where the first and second circuits are tested. The process then proceeds to step 124 where a determination is made as to whether both circuits passed the testing. If yes, the process is complete and the die is packaged.

If, however, both circuits did not pass the testing, the process proceeds to step 126 where a determination is made as to whether both circuits failed the testing. If yes, the process is complete and the die is scrapped. If, however, one of the circuits passed the testing, the process proceeds to step 128 where a determination is made as to whether the first circuit passed the testing. If yes, the process proceeds to step 130 where the die is cut to separate the first circuit from the second circuit and the first circuit is packaged as an integrated circuit. If, however, the first circuit failed the testing, the process proceeds to step 132 where the die is cut to separate the second circuit from the first circuit and the second circuit is packaged as an integrated circuit.

The preceding discussion has presented a method and apparatus for producing various integrated circuits from a single die depending on the outcome of the testing of the die. By providing such alternatives, an IC manufacturer can maintain acceptable yields while utilizing state of the art IC fabrication processes and providing more complex circuitry on a single die.

We claim:

1. An integrated circuit comprising:

a first circuit deposited on a die;

a second circuit deposited on the die;

configuration circuitry deposited on the die, wherein the configuration circuitry is operably coupled to the first circuit and the second circuit, wherein the configuration circuitry allows the first and second circuits to undergo testing and wherein the configuration circuitry configures the integrated circuit based on functional status of the first and second circuit.

2. The integrated circuit of claim 1 further comprises the configuration circuitry including a multiplexor and configuration pads, wherein the multiplexor provides configuration coupling of the first and second circuits to the configuration pads based on the functional status.

3. The integrated circuit of claim 1 further comprises the configuration circuit configuring the integrated circuit to use only the first circuit when the second circuit failed the testing.

4. The integrated circuit of claim 1 further comprises the configuration circuit configuring the integrated circuit to use only the second circuit when the first circuit failed the testing.

5. The integrated circuit of claim 1 further comprises the first circuit including a graphics processor and the second circuit including memory.

6. The integrated circuit of claim 1 further comprises the configuration circuit configuring the integrated circuit to use the first and second circuits together when both passed the testing.

7. The integrated circuit of claim 1 further comprises the configuration circuitry reconfiguring at least one of input access output access to the first circuit when the second circuit failed the testing.

8. The integrated circuit of claim 1 further comprises the configuration circuitry reconfiguring at least one of input access output access to the second circuit when the first circuit failed the testing.

9. The integrated circuit of claim 8 further comprises the configuration circuit reconfiguring the second circuit to a memory of $X^*n$ K by Y/n bits, when the second circuit is memory originally configured as X K by Y bits.

10. A method for manufacturing an integrated circuit, the method comprising the steps of:

a) depositing a first circuit and a second circuit on a die;

b) testing the first and second circuits;

c) when one of the first and second circuits fails the test, marking the die to indicate either the first circuit or the second circuit that passed the testing.

11. The method of claim 10 further comprises marking the die to indicate that both the first and second circuits passed the testing.

12. The method of claim 11 further comprises packaging the die based on the marking.

13. The method of claim 10 further comprises marking the die to indicate that both the first and second circuits failed the testing.

14. The method of claim 10 further comprises, within step (a), depositing configuration circuitry on the die.

15. The method of claim 14 further comprises instructing the configuration circuitry to reconfigure the integrated circuit to use the first circuit or the second circuit that passed the testing.

16. The method of claim 14 further comprises instructing the configuration circuitry to reconfigure the second circuit to a memory of $X^*n$ K by Y/n bits, when the second circuit is memory originally configured as X K by Y bits.

17. An integrated circuit comprises:

a video graphics circuit deposited on a die;

memory deposited on the die; and configuration circuitry deposited on the die, wherein the configuration circuitry is operably coupled to the video graphics circuit and the memory, wherein the configuration circuitry allows the video graphics circuit and the memory to undergo testing and wherein the configuration circuitry configures the integrated circuit based on functional status of the video graphics circuit and the memory.

18. An integrated circuit comprises:

a processing circuit deposited on a die;

memory deposited on the die; and configuration circuitry deposited on the die, wherein the configuration circuitry is operably coupled to the processing circuit and the memory, wherein the configuration circuitry allows the processing circuit and the memory to undergo testing and wherein the configuration circuitry configures the integrated circuit based on functional status of the processing circuit and the memory.

19. A method for manufacturing an integrated circuit, the method comprising the steps of a) depositing a first circuit and a second circuit on a die;

b) testing the first and second circuits;

c) when one of the first and second circuits fails the test, cutting the die to separate either the first circuit or the second circuit that passed the testing.

* * * * *